(12) United States Patent
Sakakibara et al.

(10) Patent No.: US 6,998,655 B2
(45) Date of Patent: Feb. 14, 2006

(54) SEMICONDUCTOR DEVICE COMPRISING MEMORIES ON THE INSIDE AND OUTSIDE OF BONDING PAD

(75) Inventors: Kazuo Sakakibara, Hyogo (JP); Katsuyoshi Watanabe, Tokyo (JP)

(73) Assignees: Mitsubishi Electric System LSI Design Corporation, Itami (JP); Renesas Technology Corp., Tokyo (JP)

( * ) Notice: Subject to any disclaimer, the term of this patent is extended or adjusted under 35 U.S.C. 154(b) by 219 days.

(21) Appl. No.: 10/191,474

(22) Filed: Jul. 10, 2002

(65) Prior Publication Data

US 2003/0057454 A1   Mar. 27, 2003

(30) Foreign Application Priority Data

Sep. 21, 2001   (JP)   ............................. 2001-288059

(51) Int. Cl.
*H01L 27/10*   (2006.01)
(52) U.S. Cl. ..................... 257/213; 257/206; 257/203
(58) Field of Classification Search ................ 257/213, 257/777; 365/226
See application file for complete search history.

(56) References Cited

U.S. PATENT DOCUMENTS

| | | | | |
|---|---|---|---|---|
| 4,724,531 A | * | 2/1988 | Angleton et al. | ........... 365/181 |
| 4,898,840 A | * | 2/1990 | Okuyama | ..................... 437/41 |
| 5,768,194 A | * | 6/1998 | Matsubara et al. | .... 365/185.33 |
| 5,805,865 A | * | 9/1998 | Mimura et al. | ................ 703/28 |
| 6,018,488 A | * | 1/2000 | Mishima et al. | ......... 365/225.7 |
| 6,069,812 A | * | 5/2000 | Lee et al. | ..................... 365/51 |
| 6,255,736 B1 | * | 7/2001 | Kaneko | ....................... 257/777 |
| 6,493,282 B1 | * | 12/2002 | Lida et al. | .................... 365/226 |
| 6,621,171 B1 | * | 9/2003 | Matsubara et al. | ......... 257/784 |
| 2001/0025364 A1 | * | 9/2001 | Kaneko | ........................ 716/1 |
| 2003/0111741 A1 | * | 6/2003 | Shimomura et al. | ........ 257/786 |
| 2003/0117828 A1 | * | 6/2003 | Mayer et al. | .................. 365/63 |
| 2003/0218248 A1 | * | 11/2003 | Koyama et al. | ............. 257/735 |
| 2004/0190339 A1 | * | 9/2004 | Shukuri et al. | ......... 365/185.05 |

FOREIGN PATENT DOCUMENTS

| | | | |
|---|---|---|---|
| DE | 4329335 | * | 3/1994 |
| JP | 4-133464 | * | 5/1992 |
| JP | 5-90499 | | 4/1993 |
| JP | 7-160527 | * | 6/1995 |
| JP | 8-288453 | | 11/1996 |
| JP | 11-53488 | | 2/1999 |
| JP | 11-297071 | * | 10/1999 |
| JP | 2000-101027 | * | 4/2000 |

* cited by examiner

*Primary Examiner*—Nathan J. Flynn
*Assistant Examiner*—Ahmed N. Sefer
(74) *Attorney, Agent, or Firm*—Oblon, Spivak, McClelland, Maier & Neustadt, P.C.

(57) ABSTRACT

A semiconductor integrated circuit is capable of filling the need for more memory space through the effective use of an already-designed core block. A block (1) including a CPU, an array (4a) of a plurality of bonding pads, and RAMs (21a, 22a) which are first memories located on the same side of the array (4a) as the block (1) are already designed. The requirement for increased memory capacity can be filled with ease by the addition of RAMs (24a, 25a) which are second memories located on the opposite side of the array (4a) from the block (1). Since the second memories are different in physical configuration from the first memories, it is easy to design a physical configuration to achieve required memory capacity outside a core block (8a) within a single-chip microcomputer (9c).

13 Claims, 11 Drawing Sheets

FIG. 2

| | | | | | | | | |
|---|---|---|---|---|---|---|---|---|
| | | | | 1 | 1 | 7C_H | 7E_H | 7D_H | 7F_H |
| | | | 1 | | 0 | 74_H | 76_H | 75_H | 77_H |
| | | 1 | | 0 | 1 | 6C_H | 6E_H | 6D_H | 6F_H |
| | | | | | 0 | 64_H | 66_H | 65_H | 67_H |
| | | | 0 | 1 | 1 | 5C_H | 5E_H | 5D_H | 5F_H |
| | | | | | 0 | 54_H | 56_H | 55_H | 57_H |
| | 1 | | | 0 | 1 | 4C_H | 4E_H | 4D_H | 4F_H |
| | | | | | 0 | 44_H | 46_H | 45_H | 47_H |
| | | | 1 | 1 | 1 | 3C_H | 3E_H | 3D_H | 3F_H |
| | | | | | 0 | 34_H | 36_H | 35_H | 37_H |
| | | 0 | | 0 | 1 | 2C_H | 2E_H | 2D_H | 2F_H |
| | | | | | 0 | 24_H | 26_H | 25_H | 27_H |
| | | | 0 | 1 | 1 | 1C_H | 1E_H | 1D_H | 1F_H |
| | | | | | 0 | 14_H | 16_H | 15_H | 17_H |
| | | | | 0 | 1 | 0C_H | 0E_H | 0D_H | 0F_H |
| | | | | | 0 | 04_H | 06_H | 05_H | 07_H |
| | | | 1 | 1 | 1 | 78_H | 7A_H | 79_H | 7B_H |
| | | | | | 0 | 70_H | 72_H | 71_H | 73_H |
| | | 1 | | 0 | 1 | 68_H | 6A_H | 69_H | 6B_H |
| | | | | | 0 | 60_H | 62_H | 61_H | 63_H |
| | | | 0 | 1 | 1 | 58_H | 5A_H | 59_H | 5B_H |
| | | | | | 0 | 50_H | 52_H | 51_H | 53_H |
| | 0 | | | 0 | 1 | 48_H | 4A_H | 49_H | 4B_H |
| | | | | | 0 | 40_H | 42_H | 41_H | 43_H |
| | | | 1 | 1 | 1 | 38_H | 3A_H | 39_H | 3B_H |
| | | | | | 0 | 30_H | 32_H | 31_H | 33_H |
| | | 0 | | 0 | 1 | 28_H | 2A_H | 29_H | 2B_H |
| | | | | | 0 | 20_H | 22_H | 21_H | 23_H |
| | | | 0 | 1 | 1 | 18_H | 1A_H | 19_H | 1B_H |
| | | | | | 0 | 10_H | 12_H | 11_H | 13_H |
| | | | | 0 | 1 | 08_H | 0A_H | 09_H | 0B_H |
| | | | | | 0 | 00_H | 02_H | 01_H | 03_H |

WORD LINE $A_0$: 0 0 1 1
$A_1$: 0 1 0 1

↑ $A_2$  ↑ $A_6$  ↑ $A_5$  ↑ $A_4$  ↑ $A_3$

Y ↑
  ↓ ←→ X

BIT LINE

| A7 | MEMORY BLOCK |
|---|---|
| 0 | RAM21a |
| 1 | RAM22a |

SEMICONDUCTOR DEVICE COMPRISING MEMORIES ON THE INSIDE AND OUTSIDE OF BONDING PAD

BACKGROUND OF THE INVENTION

1. Field of the Invention

The present invention relates to a semiconductor integrated circuit and especially to a semiconductor integrated circuit comprising a central processing unit and memories.

2. Description of the Background Art

Figure 11:
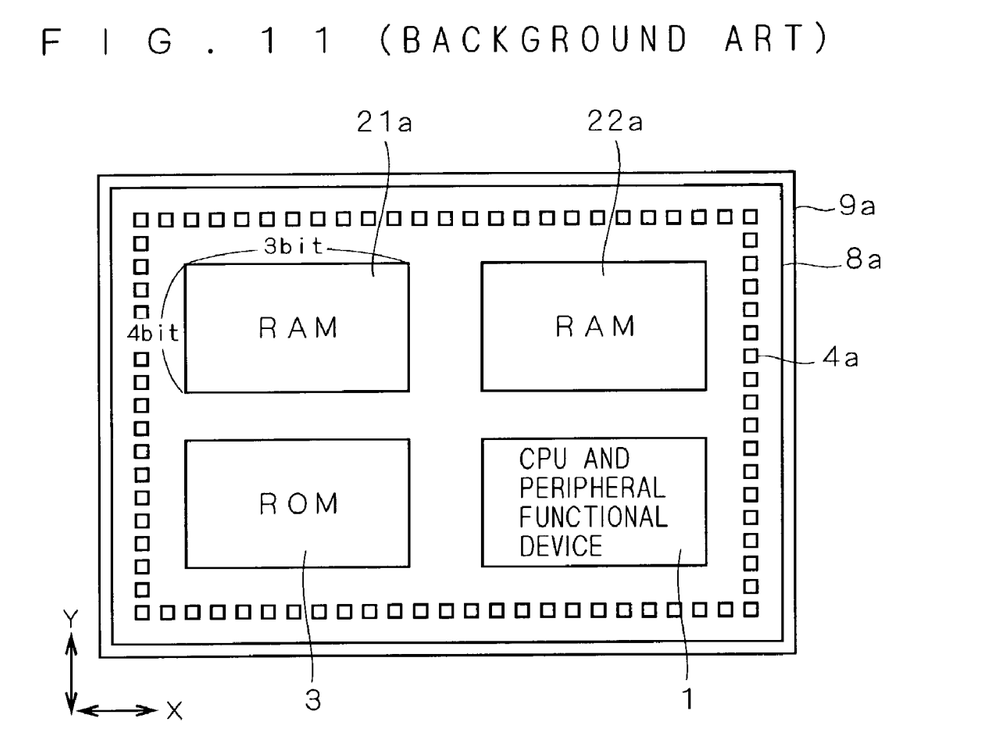
FIG. 11 is a block diagram showing the structure of a background art.

FIG. 11 is a block diagram showing the structure of a single-chip microcomputer 9a which is a conventional semiconductor integrated circuit of the background art. In the single-chip microcomputer 9a, a block 1 including a central processing unit (also referred to as a "CPU" in the specification and drawings) and peripheral functional devices, random access memories (also referred to as "RAMs" in the specification and drawings) 21a and 22a, and a read-only memory (also referred to as a "ROM" in the specification and drawings) 3 are surrounded by a bonding pad array 4a.

In terms of electrical properties and the effective use of area, the above components of the single-chip microcomputer 9a are designed as a single unit called a core block 8a.

For improving the productivity in the layout of the core block 8a, when a plurality of memories (e.g., RAMs) of the same type are located, memories having the same physical configuration have been employed. Here, the "physical configuration" refers to a concept including the number of word lines and the number of data lines. The concept further includes the sequence of access to the word and data lines when consecutive addresses are given.

Figure 12:
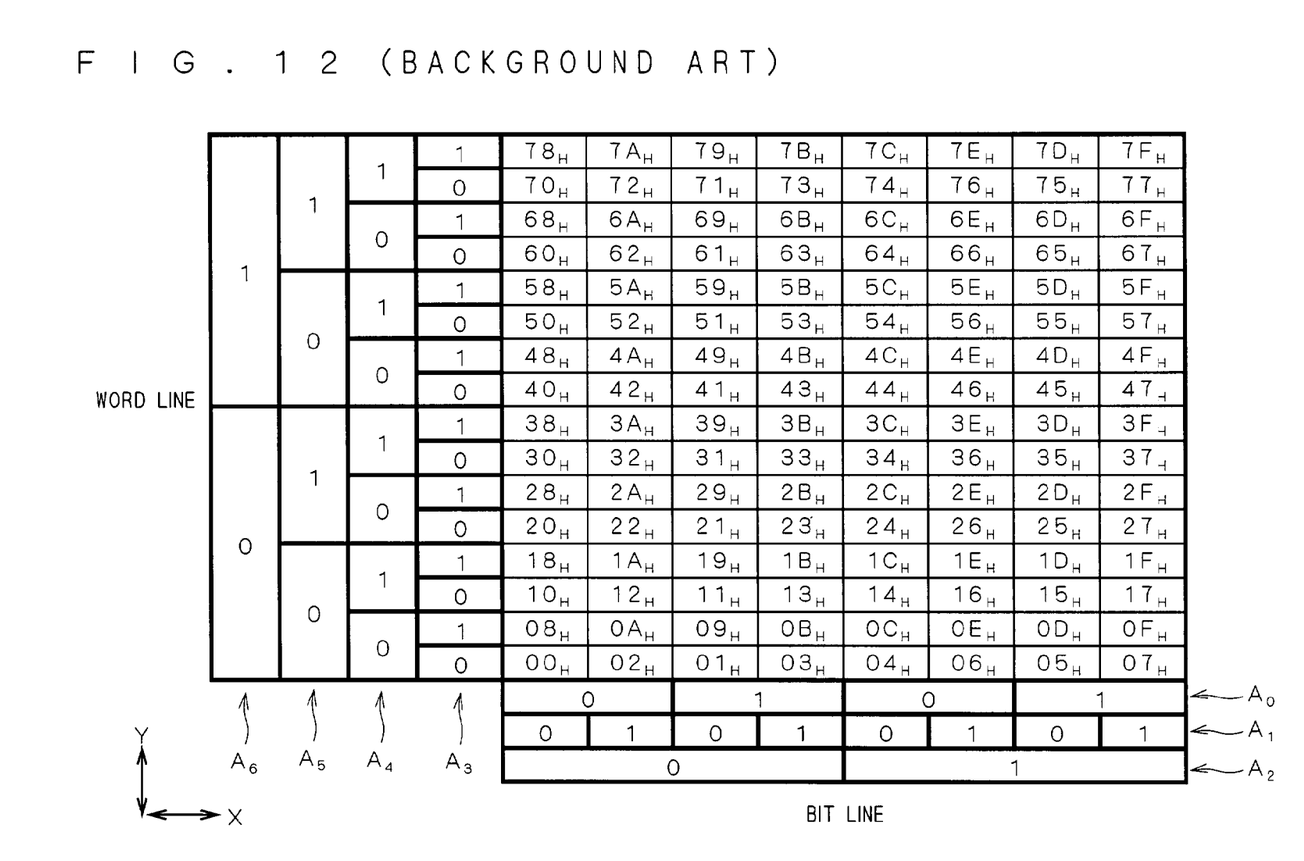
FIG. 12 illustrates data cell allocation according to a background art.

Referring to FIG. 11, for example, the RAMs 21a and 22a each have 4 bits of word lines (i.e., 16 word lines, not shown) arranged in the Y direction and 3 bits of data lines (i.e., 8 data lines, not shown) arranged in the X direction. In both the RAMs 21a and 22a, an address $A_6A_5A_4A_3A_2A_1A_0$ formed of a plurality of bits is assigned to a data cell as shown in FIG. 12. For example, the address $A_6A_5A_4A_3A_2A_1A_0=0110100$ $(=34_H)$ indicates a cell in the location identified by "$34_H$" in FIG. 12.

Figure 13:
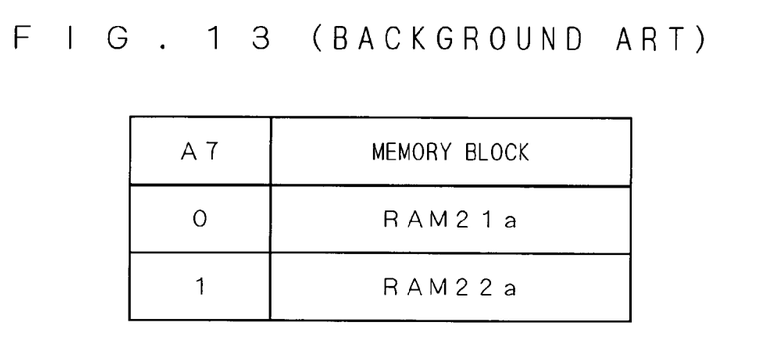
FIG. 13 illustrates how to select a plurality of RAMs 21$a$ and 22$a$ according to the background art.

Since, in this way, both the RAMs 21a and 22a have cells each indicated by the address $A_6A_5A_4A_3A_2A_1A_0$, a higher order bit $A_7$ than the bits forming the address is introduced and the RAM 21a or 22a to be accessed is selected in accordance with the value of this one bit. FIG. 13 illustrates the correspondence between the value of the bit $A_7$ and the RAMs 21a, 22a to be selected.

As above described, the components of the conventional single-chip microcomputer have been designed as a core block in terms of electrical properties and the effective use of area. And, for improving the productivity in the layout of the core block, when a plurality of memories of the same type are located, memories having the same physical configuration have been employed.

Therefore, if more memory space is required, the design of the single-chip microcomputer must start over from the design of the core block.

Figure 14:
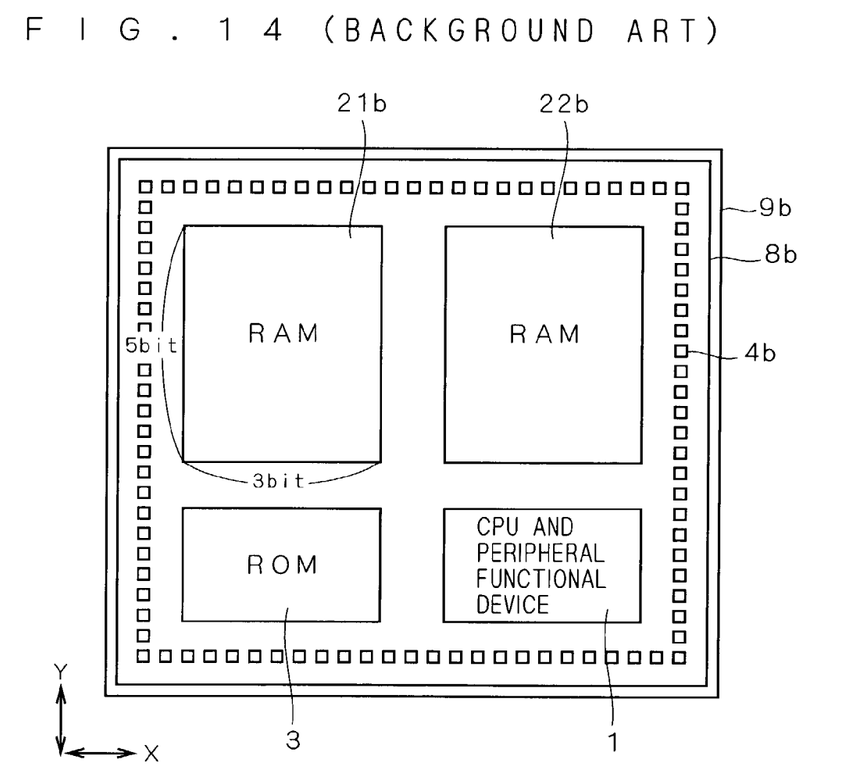
FIG. 14 is a block diagram showing the structure of another background art.

FIG. 14 is a block diagram showing the structure of a single-chip microcomputer 9b that has more memory space than the single-chip microcomputer 9a. In the single-chip microcomputer 9b, the ROM 3 remains the same but the capacities of the RAMs are doubled. More specifically; RAMs 21b and 22b each have 3 bits of data lines (i.e., 8 data lines, not shown) and 5 bits of word lines (i.e., 32 word lines, not shown). The RAMs 21b and 22b, the ROM 3, and the block 1 are surrounded by a bonding pad array 4b, which forms a core block 8b. The single-chip microcomputer 9b is thus longer in the Y direction than the single-chip microcomputer 9a.

In this fashion, even if the core block is already designed, the conventional single-chip microcomputers require redesign of the core block for giving more memory space.

SUMMARY OF THE INVENTION

The present invention has been made in view of the above conventional circumstances and an object thereof is to provide a semiconductor integrated circuit that is capable of filling the need for more memory space through the effective use of an already-designed core block.

According to the present invention, the semiconductor integrated circuit includes a central processing unit, an array of a plurality of bonding pads, at least one first memory and at least one second memory. The first memory is located on the same side of the array as the central processing unit. The second memory is located on the other side of the array from the central processing unit and different in physical configuration from the first memory.

Even if the core block, which comprises the central processing unit, the array of bonding pads, and the first memory, is already designed, it is easy to fill the requirement for increased memory capacity. Besides, the second memory that achieves the increased memory capacity is different in physical configuration from the first memory; therefore, even if they are located on the opposite side of the array from the central processing unit and the first memory, it is easy to design a physical configuration to achieve required memory capacity.

Preferably, the second memory includes a plurality of second memories.

In the address space formed of a plurality of second memories, a plurality of addresses assigned to the plurality of second memories may be connected consecutively or in an interleaved configuration. That is, there is a high degree of flexibility of address assignment.

Preferably, one of the second memories is different in the physical configuration from the others.

Even if the core block, which comprises the central processing unit, the array of bonding pads, and the first memory, is already designed, determining the configuration of the second memory hardly produces wasted space in the configuration of the semiconductor integrated circuit.

Preferably, the second memory is shaped like a rectangle, the semiconductor integrated circuit having its side parallel to one side of the rectangle.

Determining the configuration of the second memory hardly produces wasted space in the configuration of the semiconductor integrated circuit.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
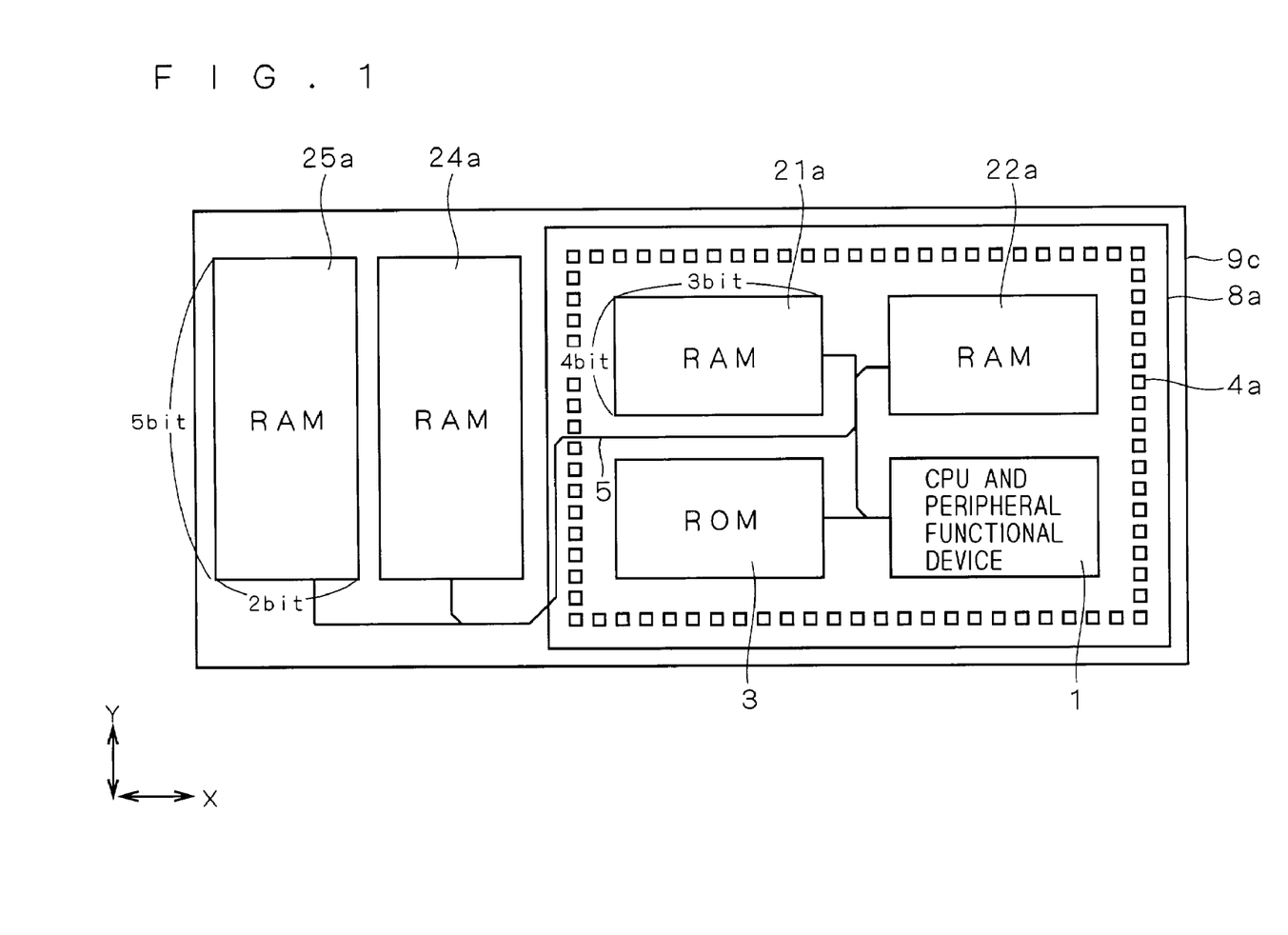
FIG. 1 is a block diagram showing the structure of a semiconductor integrated circuit according to a first preferred embodiment of the present invention.

FIG. 1 is a block diagram showing the structure of a single-chip microcomputer 9$c$ which is a semiconductor integrated circuit according to a first preferred embodiment of the present invention. The single-chip microcomputer 9$c$ comprises the core block 8$a$. In the core block 8$a$, the block 1 including a CPU and peripheral functional devices, the RAMs 21$a$ and 22$a$, and the ROM 3 are surrounded by the bonding pad array 4$a$. That is, the RAMs 21$a$, 22$a$ and the ROM 3 are memories located on the same side of the bonding pad array 4$a$ as the block 1. Such memories located on the same side of the bonding pad array 4$a$ as the block 1 are referred to as "first memories".

The single-chip microcomputer 9$c$ further comprises RAMs 24$a$ and 25$a$ that are located on the opposite side of the bonding pad array 4$a$ from the block 1. Such memories located on the opposite side of the bonding pad array 4$a$ from the block 1 are referred to as "second memories".

The RAMs 24$a$ and 25$a$ are different in physical configuration from the RAMs 21$a$ and 22$a$. For example, the RAMs 24$a$ and 25$a$ each have 5 bits of word lines (i.e., 32 word lines, not shown) arranged in the Y direction and 2 bits of data lines (i.e., 4 data lines, not shown) arranged in the X direction.

The RAMs 21$a$, 22$a$, 24$a$, and 25$a$ and the ROM 3 are connected via a bus 5 to the block 1.

Figure 2:
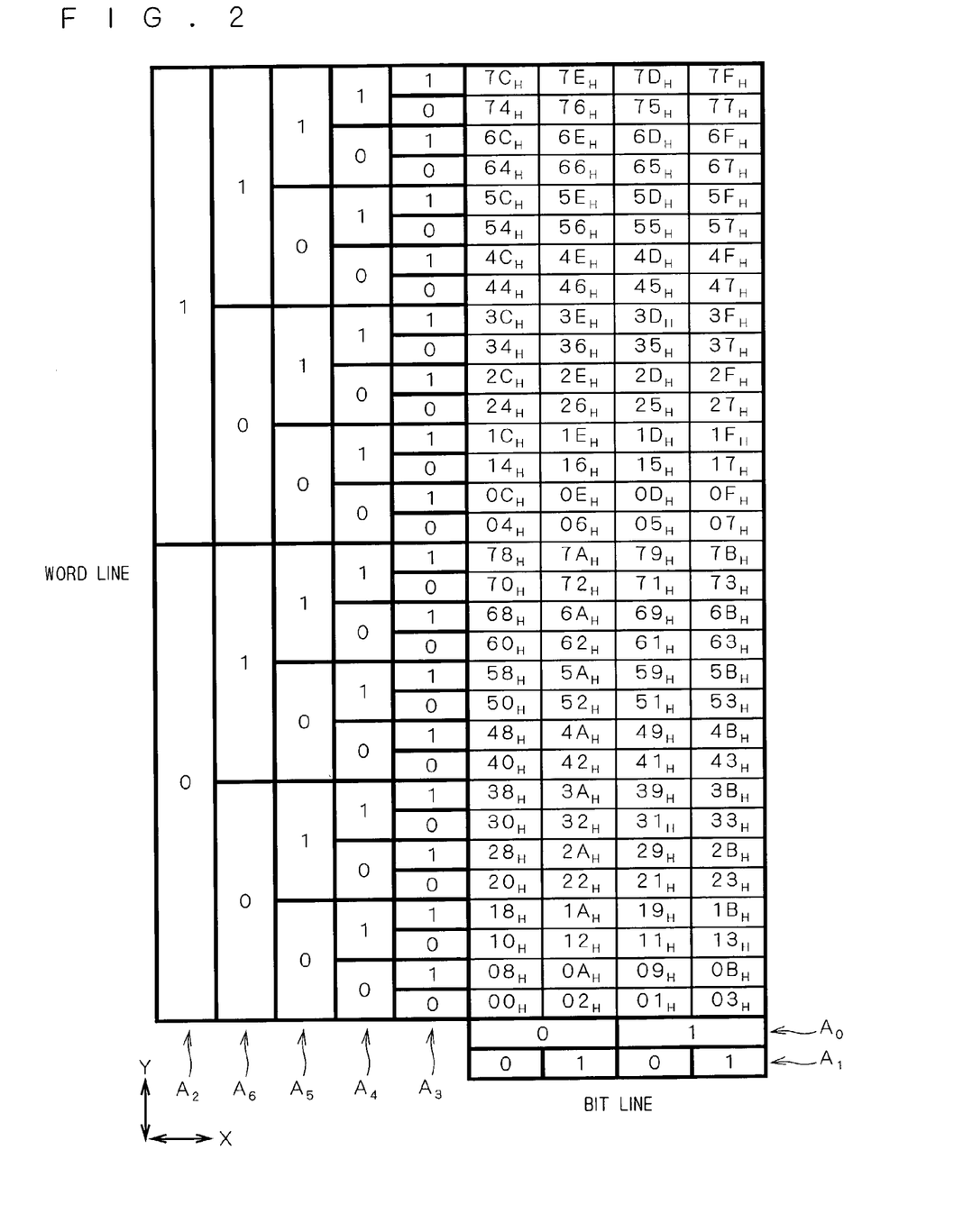
FIG. 2 illustrates data cell allocation according to the first preferred embodiment of the present invention.

FIG. 2 illustrates data cells allocated to the RAMs 24$a$ and 25$a$. FIG. 2 applies to both the RAMs 24$a$ and 25$a$. The data line is selected by a plurality of bits $A_1 A_0$ and the word line is selected by a plurality of bits $A_6 A_5 A_4 A_3 A_2$. For example, the address $A_6 A_5 A_4 A_3 A_2 A_1 A_0 = 0110100 (=34_H)$ indicates a cell in the location identified by "$34_H$" in FIG. 2.

Since the bits $A_7 A_6 A_5 A_4 A_3 A_2 A_1 A_0$ are already assigned to the RAMs 21$a$ and 22$a$ in the block 1, a further higher order bit $A_8$ is introduced and when the bit $A_8$ takes on a value "0", either the RAM 21$a$ or 22$a$ is selected according to the way of FIG. 13. When the address bits $A_8 A_7$ take on values "10" and "11", the RAMs 24$a$ and 25$a$ are respectively selected.

Even if the core block 8$a$, which comprises the block 1 including the CPU, the array 4$a$ of a plurality of bonding pads, and the RAMs 21$a$, 22$a$ being the first memories, is already designed, the need for increased memory capacity can be filled with ease by the addition of the RAMs 24 and 25$a$ which are the second memories. Besides, since the second memories are different in physical configuration from the first memories, it is easy to design a physical configuration to achieve required memory capacity outside the core block 8$a$ within the single-chip microcomputer 9$c$.

Second Preferred Embodiment

While, in the first preferred embodiment, the RAMs 24$a$ and 25$a$ which are the second memories are of the same physical configuration, a plurality of second memories may have different physical configurations. For example, the RAM 24$a$ may be divided into two RAMs 241 and 242 which differ in the bit value $A_2$ and have different addresses $A_6 A_5 A_4 A_3 A_1 A_0$.

Figure 3:
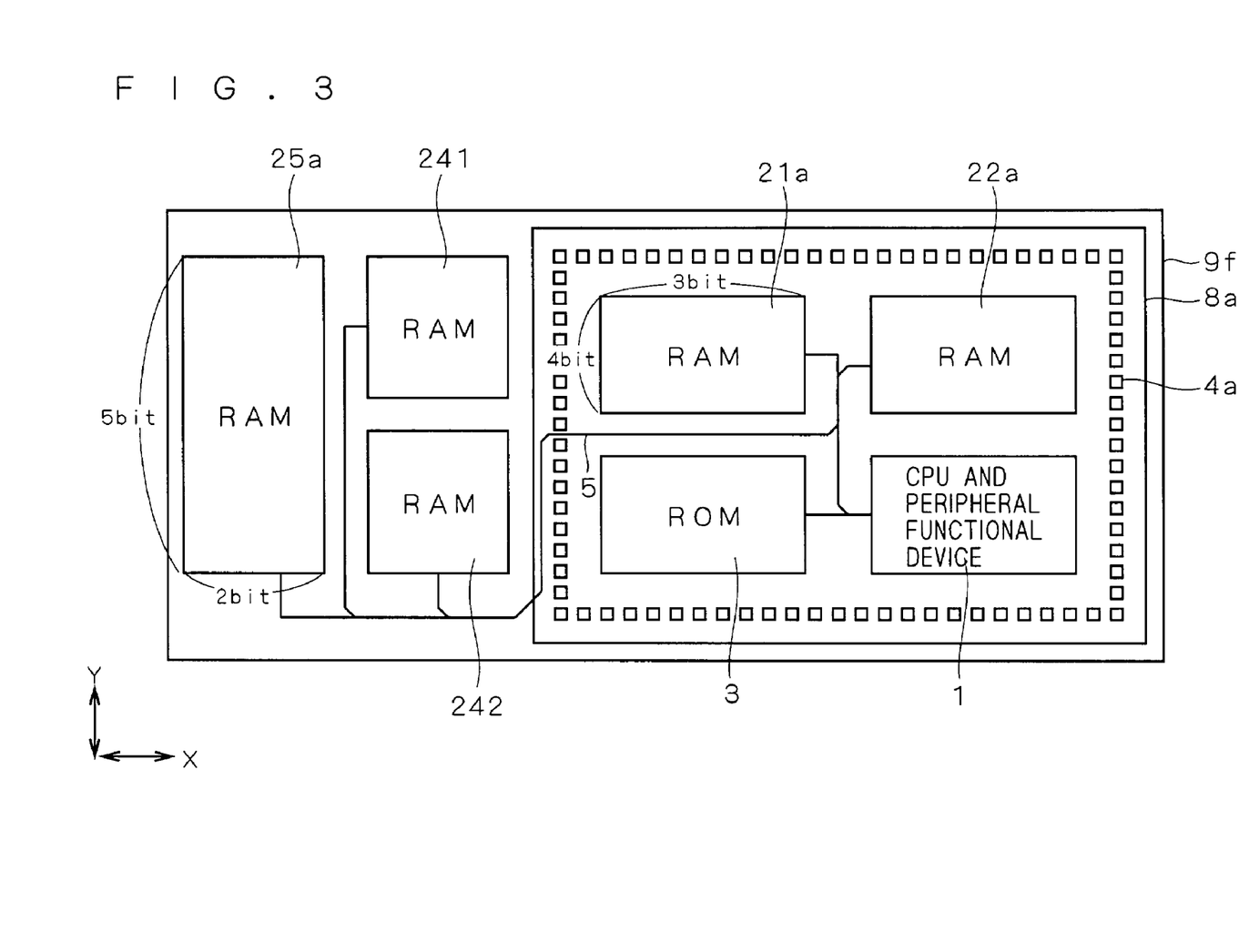
FIG. 3 is a block diagram showing the structure of a semiconductor integrated circuit according to a second preferred embodiment of the present invention.
Figure 4:
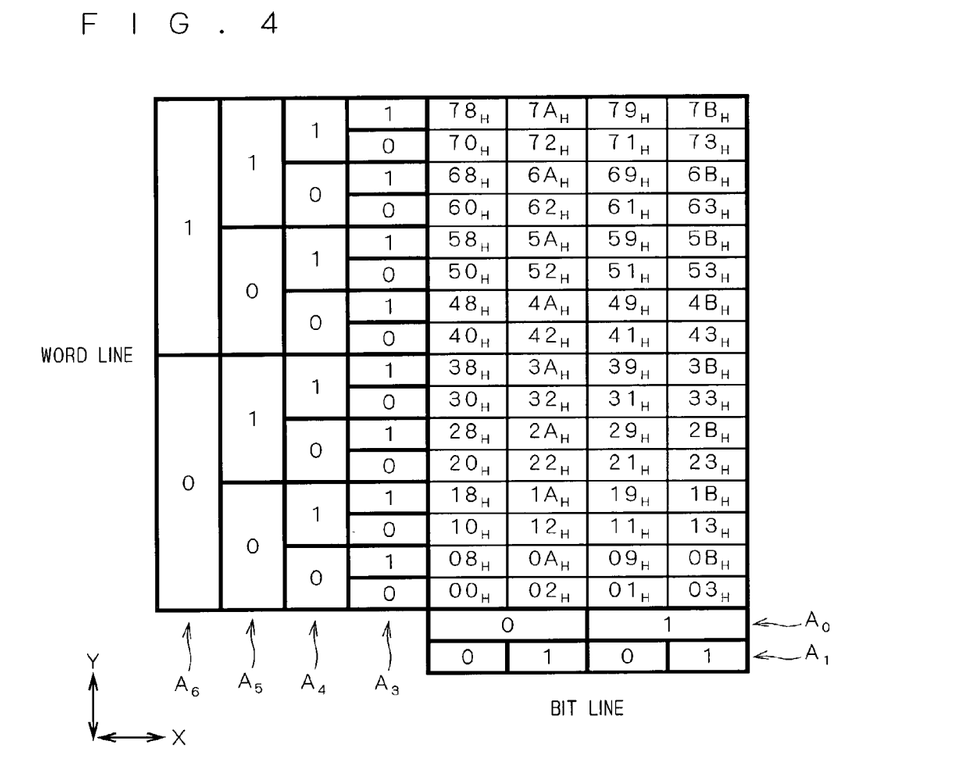
FIGS. 4 and 5 illustrate data cell allocation according to the second preferred embodiment of the present invention.
Figure 5:
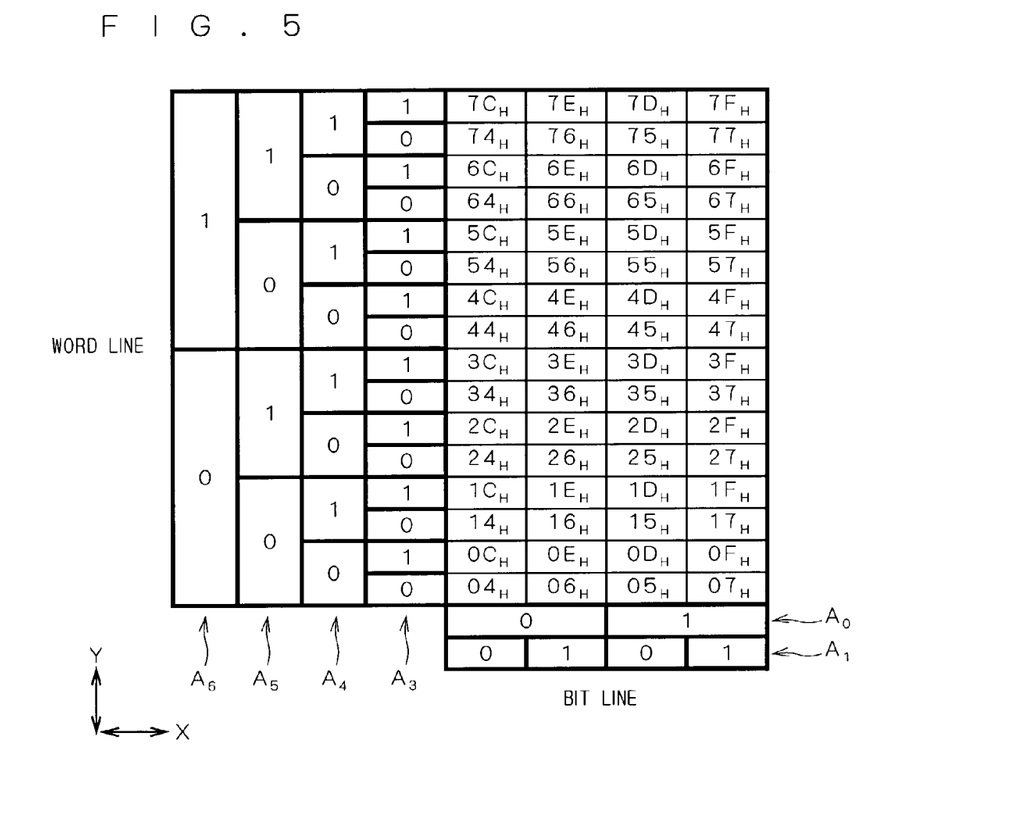

FIG. 3 is a block diagram showing the structure of a single-chip microcomputer 9$f$ that comprises the RAMs 241, 242, and 25$a$, as above described, outside the core block 8$a$. FIGS. 4 and 5 illustrate data cells allocated to such two RAMs 241 and 242. The RAMs 241 and 242 each have 4 bits of word lines (not shown) and 2 bits of data lines (not shown). FIG. 4 shows the data cells of a RAM to be selected when the bit $A_2$ takes on a value "1", while FIG. 5 shows the data cells of a RAM to be selected when the bit $A_2$ takes on a value "0".

When, in this fashion, one type of RAM such as 241, 242 and the other type of RAM such as 25$a$ within a plurality of second memories have different physical configurations, there is a high degree of flexibility in determining the configuration of the second memories even if the core block 8$a$ is already designed. Of course, the same effect as in the first preferred embodiment can also be achieved.

Third Preferred Embodiment

Figure 6:
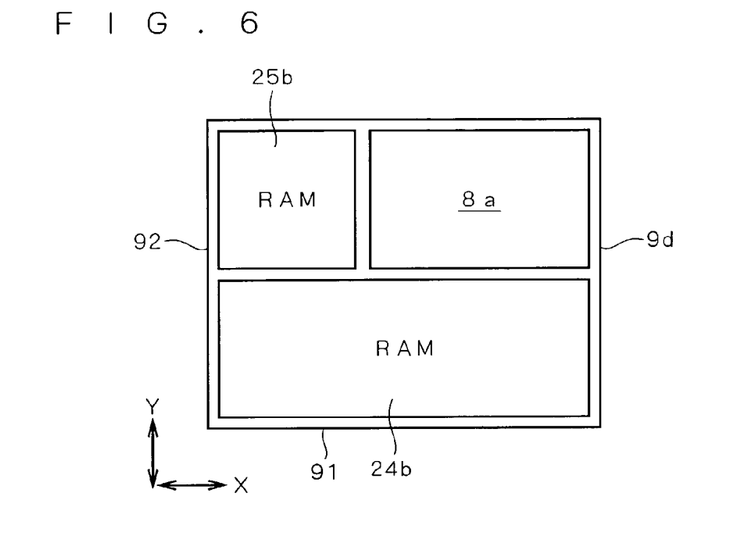
FIG. 6 is a block diagram showing the structure of a semiconductor integrated circuit according to a third preferred embodiment of the present invention.

FIG. 6 is a block diagram showing the structure of a single-chip microcomputer 9$d$ which is a semiconductor integrated circuit according to a third preferred embodiment of the present invention. The single-chip microcomputer 9$d$ comprises the core block 8$a$ described in the first preferred embodiment. The single-chip microcomputer 9$d$ further comprises RAMs 24$b$ and 25$b$ as second memories. In this preferred embodiment, the bus 5 is omitted from the drawing.

The RAMs 24$b$ and 25$b$ are shaped like a rectangle, and the single-chip microcomputer 9$d$ has its sides parallel to the sides of those rectangles. That is, the word lines of the RAM 24$b$ and 25$b$, not shown, extend in the X direction; so does one side 91 of the single-chip microcomputer 9$d$. Also, the data lines of the RAMs 24$b$ and 25$b$, not shown, extend in the Y direction; so does one side 92 of the single-chip microcomputer 9$d$.

In this fashion, the RAMs 24$b$ and 25$b$ are configured so that their respective sides are parallel to the sides of the single-chip microcomputer 9$d$. With such a configuration, even if the RAMs 24$b$ and 25$b$ as the second memories are located outside the core block 8$a$, wasted space is hardly produced in the configuration of the single-chip microcomputer 9$d$. Of course, the same effect as in the first preferred embodiment can also be achieved.

Figure 7:
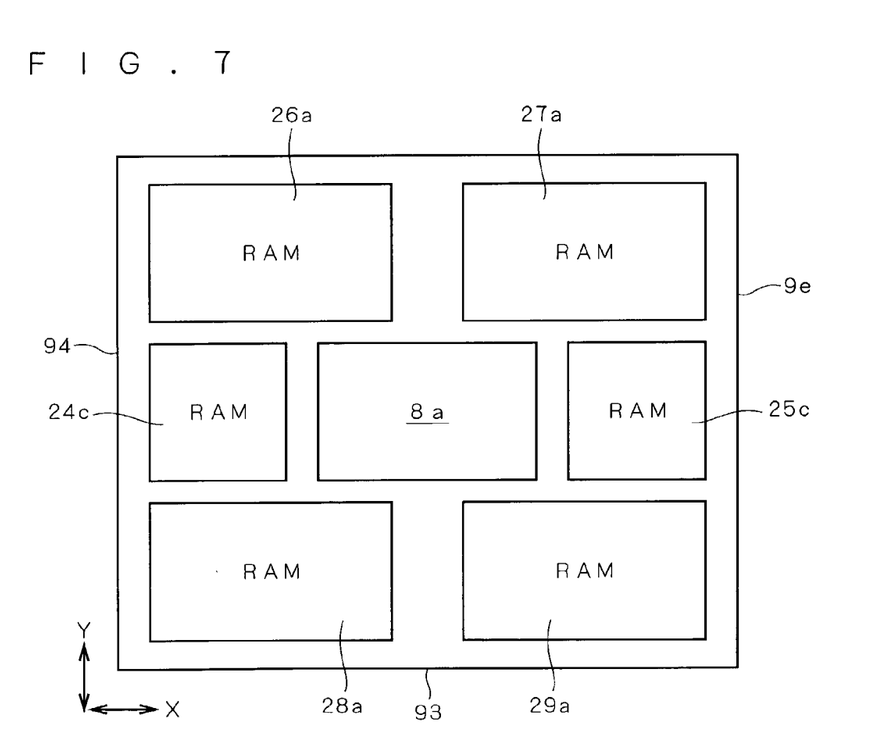
FIG. 7 is a block diagram showing the structure of a semiconductor integrated circuit according to a modification of the third preferred embodiment of the present invention.

FIG. 7 is a block diagram showing the structure of a single-chip microcomputer 9$e$ which is a semiconductor integrated circuit according to a modification of this preferred embodiment. The single-chip microcomputer 9$e$ comprises the core block 8$a$ and as second memories, RAMs 24$c$, 25$c$, 26$a$, 27$a$, 28$a$, and 29$a$ located around the core block 8$a$. In this modification, also, the bus 5 is omitted from the drawing.

The word lines of the RAMs 24c, 25c, 26a, 27a, 28a, and 29a, not shown, extend in the X direction; so does one side 93 of the single-chip microcomputer 9e. The data lines of the RAMs 24c, 25c, 26a, 27a, 28a, and 29a, not shown, extend in the Y direction; so does one side 94 of the single-chip microcomputer 9e.

Even if the second memories are located around the core block in this way, the effect of this preferred embodiment can be achieved as well.

Figure 8:
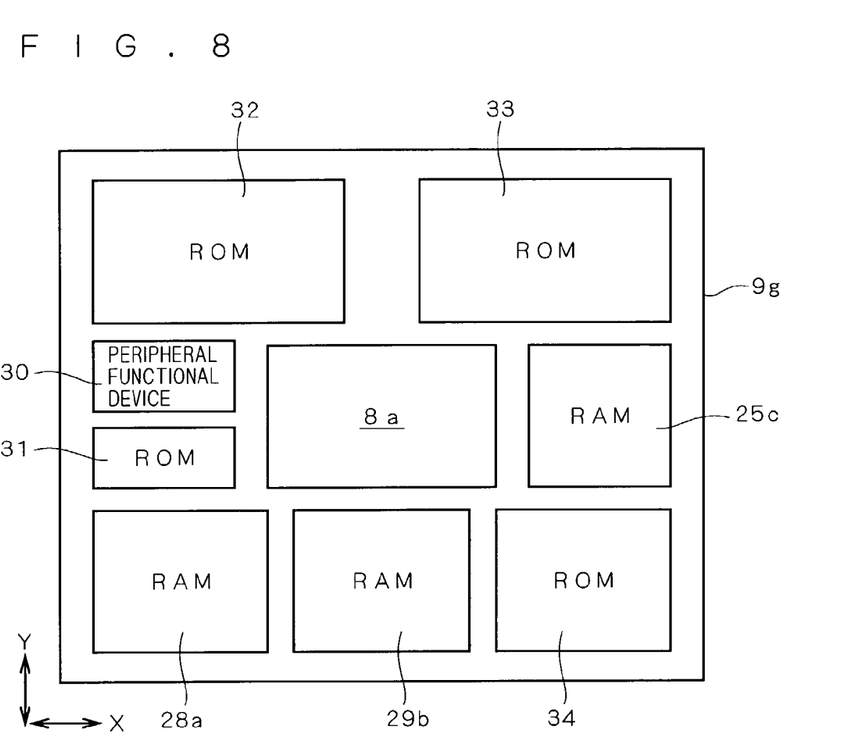
FIG. 8 is a block diagram showing the structure of a semiconductor integrated circuit according to another modification of the third preferred embodiment of the present invention.

FIG. 8 is a block diagram showing the structure of a single-chip microcomputer 9g which is a semiconductor integrated circuit according to another modification of this preferred embodiment. The single-chip microcomputer 9g comprises the core block 8a, RAMs 25c, 28b, 29b and ROMs 31, 32, 33, 34 as second memories, and a peripheral functional device 30 all of which are located around the core block 8a. In this modification, also, the bus 5 is omitted from the drawing.

Even if, as in this modification, the component other than the second memories, such as the peripheral functional device 30, is located around the core block 8a and different kinds of memories such as RAMs and ROMs are provided as the second memories, the effect of this preferred embodiment can be achieved as long as the second memories are shaped like a rectangle and the single-chip microcomputer 9d has its sides parallel to the sides of those rectangles.

It is, of course, desirable that all the second memories are rectangular in shape and configured so that their respective sides are parallel to the sides of the semiconductor element. However, it should be understood, as a matter of course, that the present invention is not limited to such optimum cases.

Fourth Preferred Embodiment

The presence of a plurality of second memories, such as the RAMs 24a and 25a in the first preferred embodiment, increases the flexibility of address assignment. That is, in the address space formed of a plurality of second memories, a plurality of addresses assigned to the plurality of second memories may be connected consecutively or in an interleaved configuration.

Figure 9:
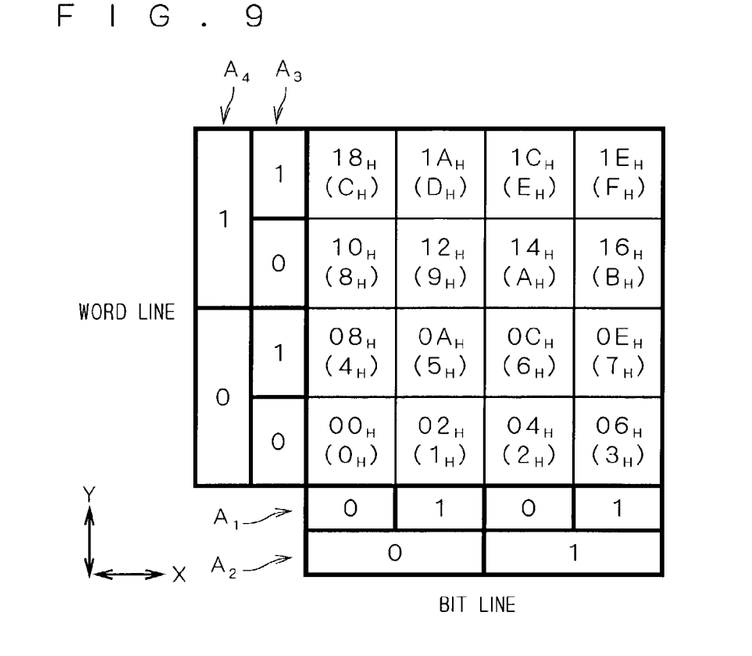
FIGS. 9 and 10 illustrate data cell allocation according to a fourth preferred embodiment of the present invention.
Figure 10:
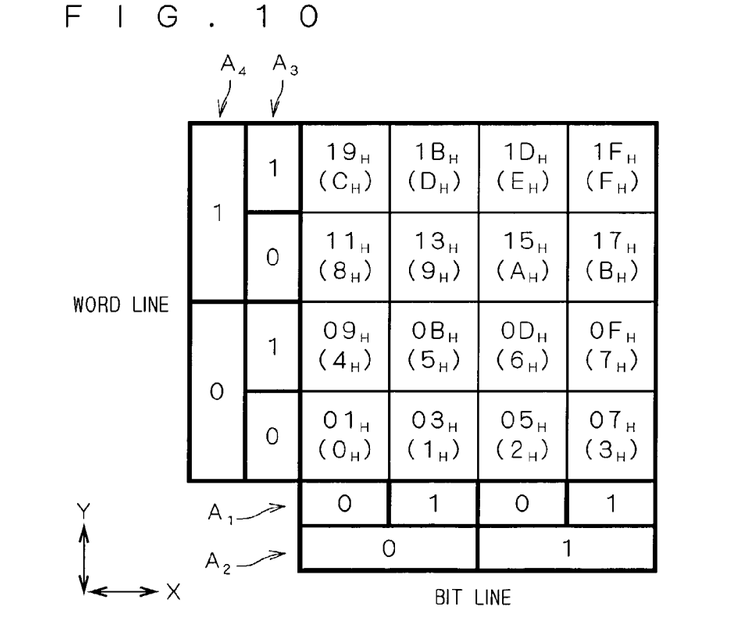

FIGS. 9 and 10 are explanatory diagrams of such address assignment to data cells, both illustrating the case where two second memories each have 2 bits of word lines (four word lines, not shown) and 2 bits of data lines (four data lines, not shown). These two second memories form a $2^2 \times 2^2 \times 2-$, i.e., 32-bit address space.

Of two addresses written in each data cell in the drawing, a parenthesized one is for a first case where the address $A_0A_4A_3A_2A_1$ changes sequentially from 00000 to 11111, and a non-parenthesized one is for a second case where the address $A_4A_3A_2A_1A_0$ changes sequentially from 00000 to 11111. The rightmost bit of the address is the lowest-order bit.

In the first case, when the address $A_0A_4A_3A_2A_1$ changes sequentially from 00000 to 01111 in the 32-bit address space formed of the two second memories, the memory shown in FIG. 9 is selected. When the address $A_0A_4A_3A_2A_1$ changes sequentially from 10000 to 11111, the memory shown in FIG. 10 is selected.

In the second case, on the other hand, when the address changes sequentially in the 32-bit address space formed of the two second memories, a data cell belonging to a different one of the memories is selected for every address change. Such a relationship between the addresses and the memories is advantageous when instructions are fetched by using a plurality of consecutive addresses, because there is more time to perform prefetch.

While the invention has been shown and described in detail, the foregoing description is in all aspects illustrative and not restrictive. It is therefore understood that numerous modifications and variations can be devised without departing from the scope of the invention.

What is claimed is:

1. A single-chip microcomputer comprising:
   a central processing unit:
   an array of a plurality of bonding pads surrounding said central processing unit;
   at least one first memory located inside of said array with said central processing unit; and
   at least one second memory located outside of said array from said central processing unit and said at least one first memory and being different in physical configuration from said at least one first memory,
   wherein said physical configuration is a concept including the number of word lines and the number of data lines.

2. The single-chip microcomputer according to claim 1, wherein said at least one second memory includes a plurality of second memories.

3. The single-chip microcomputer according to claim 2, wherein one of said plurality of second memories is different in said physical configuration from others of said plurality of second memories.

4. The single-chip microcomputer according to claim 1, wherein said at least one second memory is shaped like a rectangle, said single-chip microcomputer having its side parallel to one side of said rectangle.

5. A semiconductor integrated circuit comprising:
   a central processing unit;
   an array of a plurality of bonding pads surrounding said central processing unit;
   at least one first memory located on the same side of said array as said central processing unit; and
   at least one second memory located on the other side of said array from said central processing unit and being different in physical configuration from said at least one first memory, wherein said at least one first memory and said at least one second memory are of the same memory capacity, and said at least one first memory and said at least one second memory have different numbers of word lines.

6. The semiconductor integrated circuit according to claim 5, wherein said at least one first memory and said at least one second memory have different numbers of data lines.

7. The semiconductor integrated circuit according to claim 5, wherein said physical configuration is a concept including the number of word lines and the number of data lines.

8. A semiconductor integrated circuit comprising:
   a central processing unit;
   an array of a plurality of bonding pads surrounding said central processing unit;
   at least one first memory located on the same side of said array as said central processing unit; and at least two second memories located on the other side of said array from said central processing unit and being different in physical configuration from said at least one first memory, wherein said at least two second memories are of the same memory capacity.

9. The semiconductor integrated circuit according to claim 8, wherein said at least two of said second memories form a contiguous address space.

10. The semiconductor integrated circuit according to claim 8, wherein when an address changes sequentially in an address space formed of said at least two of said second memories, a different one of said at least two of said second memories is selected for every change of said address.

11. The semiconductor integrated circuit according to claim 8, wherein said physical configuration is a concept including the number of word lines and the number of data lines.

12. A semiconductor integrated circuit comprising:
a central processing unit;
an array of a plurality of bonding pads surrounding said central processing unit;
at least one first memory located on the same side of said array as said central processing unit; and
at least one second memory located on the other side of said array from said central processing unit and being different in physical configuration from said at least one first memory, wherein said at least one first memory and said at least one second memory are both RAMs.

13. The semiconductor integrated circuit according to claim 12, wherein said physical configuration is a concept including the number of word lines and the number of data lines.

* * * * *